United States Patent [19]

Sugimoto

[11] 4,416,160

[45] Nov. 22, 1983

[54] APPARATUS FOR DETECTING TORQUE IN ELECTRIC DYNAMOMETER

[75] Inventor: Hiroshi Sugimoto, Kobe, Japan

[73] Assignee: Mitsubishi Denki Kabushiki Kaisha, Tokyo, Japan

[21] Appl. No.: 354,042

[22] Filed: Mar. 2, 1982

[30] Foreign Application Priority Data

Apr. 27, 1981 [JP] Japan .................. 56-62430

[51] Int. Cl.³ .............................................. G01L 3/22
[52] U.S. Cl. .................................. 73/862.17; 73/116
[58] Field of Search ................ 73/116, 862.17, 862.18, 73/862.19; 310/68 B

[56] References Cited

U.S. PATENT DOCUMENTS 3,137,163  6/1964  ENGELMANN ............. 73/862.19

FOREIGN PATENT DOCUMENTS 52-51982  4/1977  Japan .
53-2591   1/1978  Japan .
420893    8/1974  U.S.S.R. ................. 73/116

Primary Examiner—Charles A. Ruehl
Attorney, Agent, or Firm—Bernard, Rothwell & Brown

[57] ABSTRACT

An apparatus for detecting torque in an electric dynamometer which is arranged such that accurate counter-voltage is obtained by utilizing an interpole winding resistance inside the DC machine, magnetic flux is computed from the aforesaid counter-voltage and speed of rotation of the DCmachine, and highly precise torque is obtained from the aforesaid magnetic flux and armature current.

1 Claim, 7 Drawing Figures

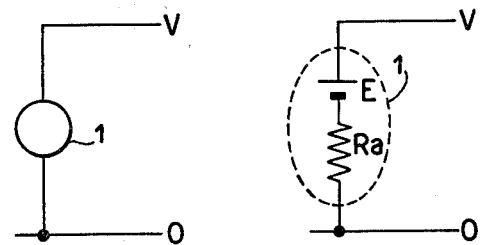
FIG. 1a (PRIOR ART)  FIG. 1b
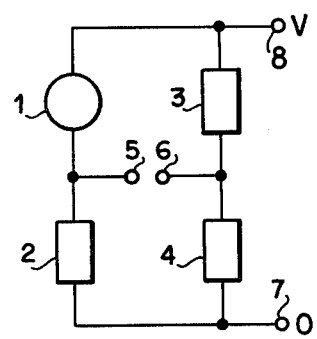
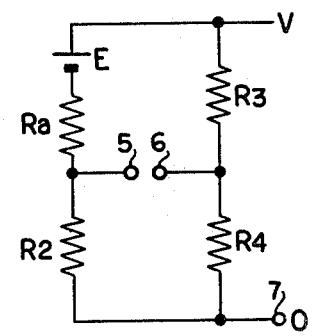
FIG. 2a  FIG. 2b
(PRIOR ART)
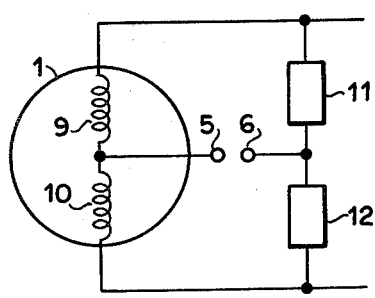
FIG. 3
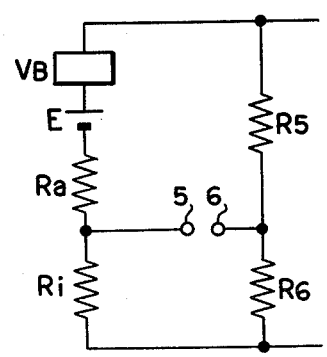
FIG. 4

APPARATUS FOR DETECTING TORQUE IN ELECTRIC DYNAMOMETER

BACKGROUND OF THE INVENTION

1. Field of the Invention

This invention relates to an electric dynamometer, and more particularly to an apparatus for detecting torque which can detect accurate torque from counter-voltage in a DC machine.

2. Description of the Prior Art

In conventional DC electric dynamometers for detecting torque, it is customary that a stator of a DC motor or DC generator (hereinafter referred to simply as "DC machine") is constructed so as to be capable of swingly moving around a rotating shaft, and the torque which functions between the stator and a rotor is measured by means of a weighing instrument connected to the stator or a strain detecting gauge attached to a load shaft.

On one hand, a torque T in a DC machine is represented by the following equation (1):

$$T = A \cdot I \cdot \phi - T_M \tag{1}$$

where I is armature current, $\phi$ is field magnetic flux, $T_M$ is mechanical loss torque, and A is constant.

Therefore, the torque T in a DC machine can be calculated, when the armature current I, field magnetic flux $\phi$, and mechanical loss torque $T_M$ are determined.

It is generally difficult to directly detect the above-mentioned magnetic flux $\phi$, so that the magnetic flux $\phi$ has ordinarily been obtained on the basis of the following equation (2):

$$\phi = B \cdot (E/N) \tag{2}$$

where E is counter-voltage, N is speed of rotation of the rotary shaft, and B is constant.

As a consequence, the magnetic flux $\phi$ can be computed, when the counter-voltage E and speed of rotation N are determined. On one hand, an accurate measurement of the speed of rotation N is comparatively easy, so that an accurate measurement of the counter-voltage E is eventually required to precisely introduce the magnetic flux $\phi$ from equation (2).

In conventional apparatuses, however, such counter-voltage E could not have precisely been measured so that accurate magnetic flux $\phi$ has not been determined, and accurate torque could not have been obtained.

That is, heretofore, terminal voltage V of an armature 1 has been measured as illustrated in FIG. 1a, and the terminal voltage V thus measured has been considered to be the counter-voltage E, i.e., $E \approx V$ in order to simply obtain the counter-voltage E. However, accurate measurement of the counter voltage E cannot absolutely be effected in the manner as stated above. This is because an equivalent circuit for armature winding has a DC resistance component $R_a$ as illustrated in FIG. 1b. More specifically, the counter-voltage E is represented by the following equation (3):

$$E = V - I \cdot R_a \tag{3}$$

where $R_a$ is DC resistance component of the armature winding, V is terminal voltage of the armature winding, and I is current flowing through the armature winding.

Consequently, as apparent from equation (3), an error corresponding to $I \cdot R_a$ exists in such system in which the terminal voltage V of the armature 1 is considered to be counter-voltage, so that accurate measurement becomes difficult.

In view of the above, a device as shown in FIGS. 2a and 2b has been proposed as a system by which relatively accurate counter-voltage can be obtained.

That is, FIG. 2a shows a circuit for introducing such counter-voltage, and FIG. 2b shows an equivalent circuit for the circuit of FIG. 2a in which a resistor 2 having resistance value $R_2$ is connected to an armature 1. Further, resistors 3 and 4 having resistance values $R_3$ and $R_4$, respectively, are inserted in the circuit of FIG. 2a in parallel to the armature 1 and the resistor 2. A terminal 5 is inserted in between the armature 1 and resistor 2, while a terminal 6 is inserted in between the resistors 3 and 4. Reference numerals 7 and 8 designate terminals connected to an external power source (not shown), respectively. The principle of the system as stated above will be described hereinbelow in conjunction with FIGS. 2a and 2b.

If it is assumed that voltage V is applied to the terminals 7 and 8, the voltage between both ends of the resistor 4 is $VR_4$, and the voltage between both ends of the resistor 2 is $VR_2$, respectively, these voltages $VR_4$ and $VR_2$ can be computed in terms of the following equations (4) and (5), respectively.

$$VR_4 = \frac{V \cdot R_4}{R_3 + R_4}, \tag{4}$$

$$VR_2 = (V - E) \cdot \frac{R_2}{R_a + R_2}. \tag{5}$$

Then, the voltage between the terminals 5 and 6 is given by the following equation (6):

$$VR_4 - VR_2 = \frac{V \cdot R_4}{R_3 + R_4} - (V - E)\frac{R_2}{R_a + R_2} = \tag{6}$$

$$\frac{V}{\frac{R_3}{R_4} + 1} - \frac{(V - E)}{\frac{R_a}{R_2} + 1}$$

where if the respective resistance values are selected so as to become $R_3/R_4 = R_a/R_2$, the following equation is obtained:

$$VR_4 - VR_2 = \frac{V - V + E}{\frac{R_a}{R_2} + 1} = E\left(\frac{1}{\frac{R_a}{R_2} + 1}\right). \tag{7}$$

That is, when the ratio $R_a/R_2$ of the voltage between the terminals 5 and 6 is invariable, a value proportional to the counter-voltage E is obtained. As a result, such value is not influenced by the armature current or armature voltage, so that it becomes possible to detect the accurate counter-voltage E.

In practice, however, a value of the DC resistance component $R_a$ of an armature winding fluctuates in response to temperature change followed by the operation, and it results in an error, so that precise detection cannot be attained in respect of counter-voltage. More specifically, the resistance component $R_a$ varies in accordance with temperature change due to the atmosphere or operation of the device. In other words, if it is assumed that the resistance of the armature winding at a standard temperature is $R_{ao}$, resistance temperature coefficient is $\alpha$, and a difference between the standard temperature and a temperature of the armature winding is t, the resistance component $R_a$ of armature winding is given by the following equation (8):

$$R_a = R_{ao}(1 + \alpha t) \qquad (8)$$

The system for measuring the counter-voltage E according to the device as illustrated in FIGS. 2a and 2b is accompanied with such difficult condition that the ratio $R_a/R_2$ is invariable, so that the counter voltage E cannot accurately be measured at all times, and accurate detection of torque becomes also difficult.

SUMMARY OF THE INVENTION

Accordingly, an object of the present invention is to provide an apparatus for detecting torque in electric dynamometers by which the disadvantages in such conventional devices as mentioned above can be eliminated.

Another object of the invention is to provide an apparatus for detecting torque in electric dynamometers by which counter-voltage in a DC machine can accurately be calculated, whereby precise torque can be obtained.

Further objects and advantages of the present invention will be more apparent from the following detailed description in conjunction with an embodiment of the invention.

BRIEF DESCRIPTION OF THE DRAWINGS

FIG. 1a is a circuit diagram for illustrating a system for obtaining counter voltage of a DC machine in a torque detection apparatus for conventional DC electric dynamometers;

FIG. 1b is a circuit diagram illustrating an equivalent circuit for the circuit in FIG. 1a;

FIG. 2a is a circuit diagram for obtaining counter-voltage in a DC machine according to another conventional example;

FIG. 2b is a circuit diagram illustrating an equivalent circuit for the circuit of FIG. 2a;

FIG. 3 is a circuit diagram for illustrating a system for obtaining counter-voltage of a DC machine in a torque detection apparatus for the DC electric dynamometer according to an embodiment of the present invention;

FIG. 4 is a circuit diagram illustrating an equivalent circuit for the circuit of FIG. 3.

DETAILED DESCRIPTION OF A PREFERRED EMBODIMENT OF THE INVENTION

Figure 5:
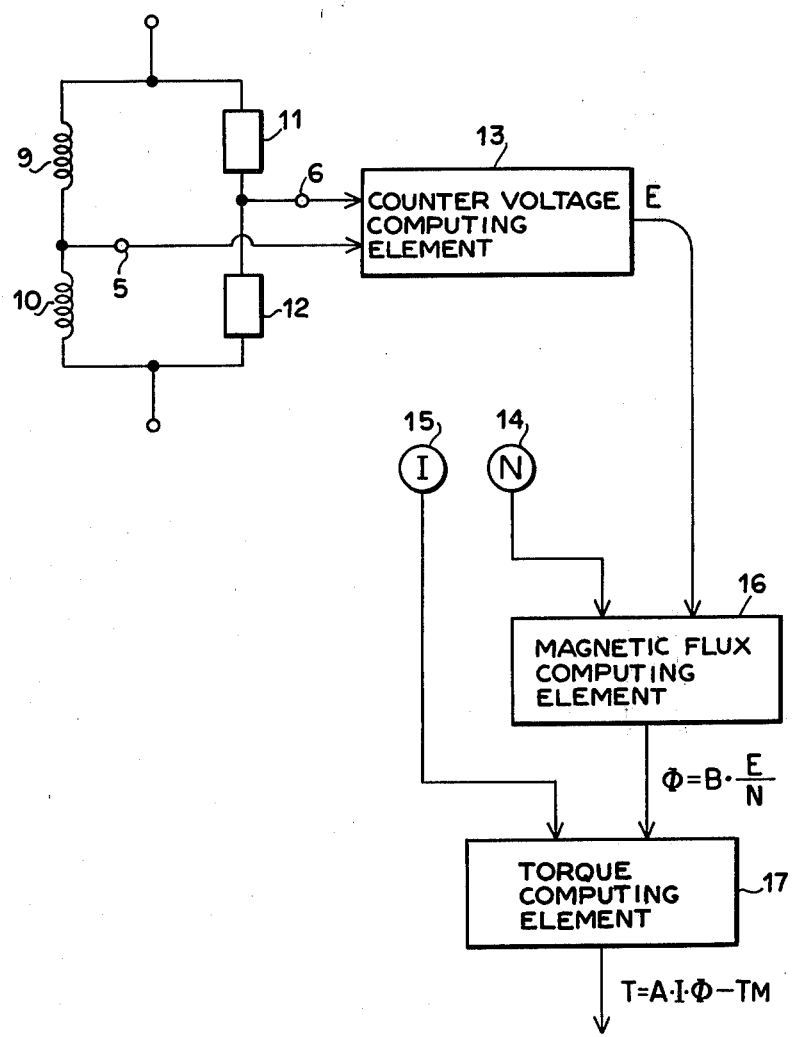
FIG. 5 is a block diagram illustrating an apparatus for calculating torque on the basis of the counter-voltage obtained by the system in FIG. 3.

Referring to FIG. 3, an armature 1 consists of an armature winding 9 and interpole winding 10. Resistors 11 and 12 having resistance values $R_5$ and $R_6$, respectively, are connected to the windings 9 and 10 in parallel thereto. Further a terminal 5 is connected in between the armature winding 9 and interpole winding 10 as well as a terminal 6 is connected in between the resistors 11 and 12.

FIG. 4 illustrates an equivalent circuit for the circuit of FIG. 3 in which a resistor $R_a$, as the DC resistance component of the armature winding 9, is connected in series with a resistor $R_i$, as the resistance component of the interpole winding 10. To the other end of the resistor $R_a$, the negative pole of a DC power source E is connected, and an element $V_B$, as brush drop voltage, is connected to the positive pole of the power source E. Moreover, a resistance value $R_6$ corresponding to a resistor 12 is connected to the other end of the aforesaid resistor $R_i$ for the interpole winding resistance value. In addition, a resistance value $R_5$ corresponding to a resistor 11 is inserted in between the resistance value $R_6$ and the other end of the aforesaid element $V_B$.

The circuit according to the present invention having the construction as mentioned above differs from a conventional example in which the outer resistor 2 is in series with the armature winding shown in FIG. 2, and differs absolutely in such point that the interpole winding resistance inside the DC machine is utilized in the circuit of the invention. Due to such difference, the measurement of counter-voltage can be effected with a very precise value in the present invention as described hereinbelow.

Namely, when a potential difference V between the terminals 5 and 6 is considered, it is represented by the following equation (9):

$$V = (V_B + E)\left(\frac{1}{\frac{R_a}{R_i} + 1}\right) \qquad (9)$$

as established in equation (7). If the equation (9) is rearranged, the DC power source is represented by the following equation (10):

$$E = V \cdot \left(\frac{R_a}{R_i} + 1\right) - V_B \qquad (10)$$

That is, if a ratio $R_a/R_i$ is invariable, the counter-voltage can accurately be computed with no influence exerted by the armature current or armature voltage. Meanwhile the interpole winding 10 exists in the interior of the DC machine as in the case of the armature winding 9 and accordingly, temperature change followed by the atmosphere or operation of the apparatus varies also as in the case of the armature winding 9. As a consequence, the ratio $R_a/R_i$ may be considered to be always constant even under a temperature change, so that accurate counter-voltage can be obtained.

FIG. 5 is a block diagram illustrating a torque detection apparatus for computing accurate torque of a DC machine based on such counter-voltage E obtained by the system as mentioned above in which the same reference numerals or characters as those of FIG. 4 designate the same parts as those of FIG. 4, respectively. A counter-voltage computing element 13 for obtaining the counter-voltage E in accordance with equation (10) is connected to the terminals 5 and 6, respectively. An output E of the counter-voltage computing element 13 is put into a magnetic flux computing element 16. On one hand, an output N from a device 14 for detecting speed of rotation which is connected to a rotor of the DC machine and generates a signal in response to a speed of rotation of the rotor is inputted to the aforesaid magnetic flux computing element 16. The magnetic flux computing element 16 functions to transmit a magnetic flux $\phi$ obtained from the aforesaid outputs E and N in accordance with an equation $\phi = B \cdot (E/N)$ to a torque computing element 17. An output I from an armature current detector 15 for detecting armature current in the DC machine is further inputted to the aforesaid torque computing element 17. The torque computing element 17 functions to obtain a torque T in accordance with equation (1).

Namely, the counter-voltage computing element 13 introduces a value of the voltage V between the terminals 5 and 6 to effect the operation of equation (9), whereby the counter-voltage $E = V \cdot (R_a/R_i + 1) - V_B$ is transmitted to the magnetic flux computing element 16. In the magnetic flux computing element 16, the computation of magnetic flux $\phi$ is performed by means of counter voltage E obtained from the counter voltage computing element 13, speed of rotation N, and a constant B which has previously been set in accordance with equation (2), and the results obtained are transmitted to the torque computing element. In the torque computing element 17, a torque $T = A \cdot I \cdot \phi - T_M$ is obtained by means of magnetic flux $\phi$ introduced from the magnetic flux computing element 16, a armature current I of the DC machine detected by the armature current detector 15, a constant A which has previously been set, and mechanical loss torque in accordance with equation (1). All the computing elements utilized in the present embodiment are conventional ones.

As described above, such an arrangement in which the resistance values $R_5$ and $R_6$ having the same ratio as that of the armature winding resistance and interpole winding resistance are connected in series and the resistors thus connected are inserted in parallel to the armature, a potential difference V between a point for connecting the armature winding with the interpole winding existing in the interior of the DC machine as in the case of the aforesaid armature winding and a point for connecting the first resistor $R_5$ with the second resistor $R_6$ is obtained to calculate the counter-voltage, and torque is obtained on the basis of the counter-voltage thus calculated is proposed in accordance with the present invention. Thus, accurate counter-voltage can be obtained with no influence exerted by armature current or armature voltage, besides the armature winding is not influenced by the fluctuation of temperature in the apparatus according to the present invention. Therefore, the present invention has the advantage that the torque T obtained on the basis of such accurate counter-voltage is highly precise.

What is claimed is:

1. An apparatus for detecting torque in an electric dynamometer which comprises:

first and second resistors having the same ratio as resistance ratio $R_a/R_i$ of an armature winding resistance $R_a$ to an interpole winding resistance $R_i$ of the DC machine, said first and second resistors being in series and inserted in parallel to the armature of said DC machine;

a counter-voltage computing element connected to a point for connecting said armature winding with said interpole winding and a point for connecting said first resistor with said second resistor, respectively, and by which a counter voltage E of said DC machine is computed from a potential difference V between said points in accordance with the following equation:

$$E = V \times \frac{R_a + R_i}{R_i} - V_B$$

where $V_B$ is brush drop voltage;

a device for detecting speed of rotation of a rotor of said DC machine connected to said rotor and generating a signal in response to the speed of rotation of said rotor;

a magnetic flux computing element for transmitting an output signal by receiving an output signal from said device for detecting speed of rotation as well as an output signal from said counter-voltage computing element;

an armature current detector for detecting armature current of said DC machine; and a torque computing element for obtaining torque by receiving an output signal from said magnetic flux computing element and an output signal from said armature current detector.

* * * * *